(12) United States Patent
Qin

(10) Patent No.: US 12,597,791 B1
(45) Date of Patent: Apr. 7, 2026

(54) BATTERY CHARGER

(71) Applicant: Xueling Qin, Guangdong (CN)

(72) Inventor: Xueling Qin, Guangdong (CN)

( * ) Notice: Subject to any disclaimer, the term of this patent is extended or adjusted under 35 U.S.C. 154(b) by 3 days.

(21) Appl. No.: 19/223,720

(22) Filed: May 30, 2025

(51) Int. Cl.
| | |
|---|---|
| *H02J 7/00* | (2006.01) |
| *H05K 5/03* | (2006.01) |
| *H05K 7/14* | (2006.01) |

(52) U.S. Cl.
CPC .......... *H02J 7/0045* (2013.01); *H02J 7/0042* (2013.01); *H05K 5/03* (2013.01); *H05K 7/1422* (2013.01)

(58) Field of Classification Search
CPC ........ H02J 7/0045; H02J 7/0042; H05K 5/03; H05K 7/1422; H01M 10/46
USPC .......................................... 320/107, 112, 113
See application file for complete search history.

(56) References Cited

U.S. PATENT DOCUMENTS

| | | | |
|---|---|---|---|
| 8,710,996 B1 * | 4/2014 | Gronneberg .......... | H02J 7/0045 |
| | | | 320/113 |
| 2002/0063550 A1 * | 5/2002 | Chen ..................... | H02J 7/0045 |
| | | | 320/110 |
| 2007/0159133 A1 * | 7/2007 | Kang .................... | H02J 7/0042 |
| | | | 320/107 |
| 2011/0177386 A1 * | 7/2011 | Tada ................... | H01M 50/209 |
| | | | 429/178 |
| 2024/0170715 A1 * | 5/2024 | Shao ................... | H01M 10/446 |

* cited by examiner

*Primary Examiner* — Drew A Dunn
(74) *Attorney, Agent, or Firm* — Hawaii Patent Services; Nathaniel K. Fedde; Kenton N. Fedde

(57) ABSTRACT

The present disclosure relates to the technical field of battery chargers, providing a battery charger. The charger comprises a lower cover assembly, an upper cover assembly, and a charging module. Space utilization is optimized through a circumferential array battery layout, where the battery negative terminal connects to the electrode plate via a contact spring, and the positive terminal forms a circuit with the circuit board through a metal contact. When the upper cover is closed, the compression spring is compressed to store energy and secure the battery; when the upper cover is opened, the spring releases its elastic force to drive the battery bracket, lifting the battery to a position where it can be easily removed.

20 Claims, 16 Drawing Sheets

BATTERY CHARGER

TECHNICAL FIELD

The present disclosure relates to the technical field of chargers, particularly to a battery charger.

BACKGROUND

Currently, most mainstream battery chargers on the market adopt a horizontally arranged layout, requiring the charging compartment to accommodate batteries side by side. When the number of batteries to be charged increases, the device's overall size must be expanded by lengthening the body structure, resulting in insufficient portability.

For example, U.S. Pat. No. 18,892,735 describes a charging base installed inside the housing, with a plurality of parallel positioning slots formed on the charging base. The battery is placed inside the housing, with one end connected to the positive plate and the other end connected to the negative plate.

This configuration allows for charging vertically aligned batteries, significantly reducing the charger's volume and facilitating portability and storage. However, the aforementioned patent still has certain drawbacks. After charging is completed, the operator must reach inside the housing to remove the battery, which is cumbersome and inconvenient for users.

SUMMARY

The present disclosure provides a battery charger to address the issues raised in the background.

To achieve the above objective, the present disclosure adopts the following technical solutions:

A battery charger comprises a housing, formed by an upper cover assembly and a lower cover assembly configured with an openable/closable connecting mechanism, wherein the lower cover assembly is provided with a battery compartment; and a charging module, comprising a multi-contact electrode assembly disposed in the lower cover assembly and a circuit control assembly disposed in the upper cover assembly, wherein the circuit control assembly is provided with a battery electrode connection terminal, and the multi-contact electrode assembly forms another battery electrode connection terminal through a contact spring; a liftable battery carrier mechanism, comprising: a substrate axially displaceably installed in the battery compartment, carrying a battery and provided with a limit through-hole corresponding to the contact spring; and a push rod fixedly connected to a mounting substrate and having an axially extending chamber inside; a resilient energy storage unit disposed in the chamber, with a bottom end thereof abutting the lower cover assembly. In a case where the upper cover assembly is closed, the circuit control assembly abuts a top of the push rod and presses the push rod downward, causing the resilient energy storage unit to store energy, while driving the mounting substrate downward to allow the contact spring to pass through the limit through-hole, establishing a circuit for charging the battery. In a case where the upper cover assembly is opened, the resilient energy storage unit releases an elastic force to drive the push rod upward, lifting the mounting substrate so that a top of the battery rises above a lowest opening plane of the lower cover assembly.

A battery charger comprises a housing, formed by an upper cover assembly and a lower cover assembly configured with an openable/closable connecting mechanism, wherein the lower cover assembly is provided with a battery compartment; and a charging module, comprising a first conductive assembly arranged on the lower cover assembly, comprising an elastically deflectable contact spring; and a second conductive assembly arranged in the upper cover assembly, having a connection node spatially corresponding to the contact spring; and a liftable battery carrier mechanism, comprising: a substrate axially displaceably installed in the battery compartment, carrying a battery and provided with a limit through-hole corresponding to the contact spring; and a push rod fixedly connected to the substrate; and a resilient energy storage unit coaxially arranged with the push rod, one end of which is fixedly connected to the push rod, and the other end abuts against the lower cover assembly. In a case where the upper cover assembly is closed, the upper cover assembly forms mechanical interference with a top end of the push rod, driving the push rod to axially displace and compress the resilient energy storage unit, while moving the substrate downward to allow the contact spring to pass through the limit through-hole, establishing a circuit for charging the battery. In a case where the upper cover assembly is opened, the resilient energy storage unit drives the push rod to displace reversely and lifts the substrate, causing a top of the battery to be higher than a lowest opening plane of the lower cover assembly.

The beneficial effects of the present disclosure over the prior art are as follows: the battery is placed inside the base cover, with its bottom in contact with the top of the mounting plate, enabling the mounting plate to support the battery; after placing a plurality of batteries, the operator closes the outer upper cover, which is then limited by the spring-loaded cover button; simultaneously, the inner upper cover pushes the battery bracket downward, causing the bracket to move the battery downward; at this point, the battery contacts the contact spring, forming a charging circuit and initiating charging; upon completion of charging, the spring-loaded cover button is pressed to release the limitation on the outer upper cover; the fixing rod moves upward under the action of the compression spring, driving the metal contact upward and flipping the outer upper cover open; when the outer upper cover is opened, the pressure on the fixing cylinder from the inner upper cover is released, allowing the fixing cylinder to move upward under the elastic potential energy of the telescopic spring, synchronously lifting the mounting plate and thereby raising the battery, which ensures the top of the battery is higher than the top of the inner base cover, facilitating easy removal by the operator.

BRIEF DESCRIPTION OF DRAWINGS

The drawings, which form part of this application, are provided to further illustrate the present disclosure. The illustrative embodiments and the descriptions thereof are intended to explain the present disclosure and do not constitute any undue limitation thereof. In the drawings.

Figure 1:
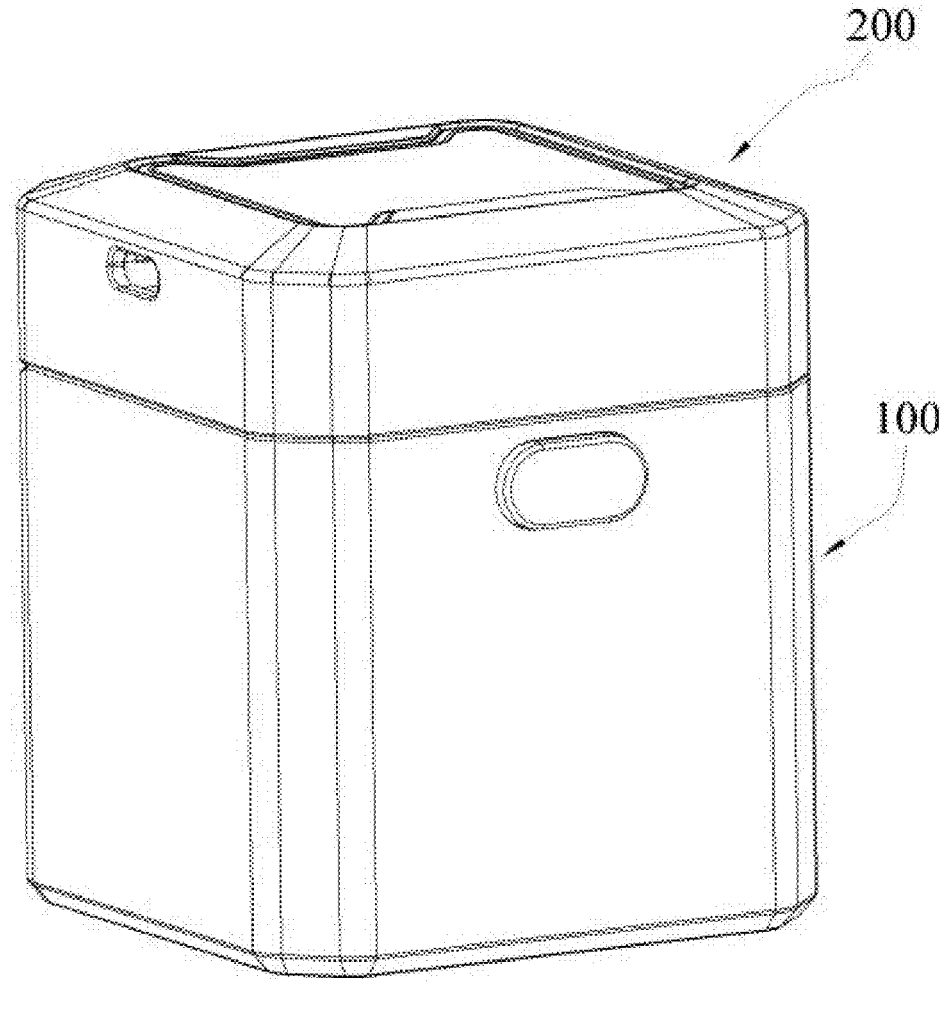
FIG. 1 is a perspective schematic view of an embodiment provided by the present disclosure.

Reference sigs: Lower cover assembly (100); Base cover (110); Spring-loaded cover button (111); Inner base cover (120); Electrode plate (130); Contact spring (140); Compression spring (150); Fixing rod (160); Battery bracket (170); Mounting plate (171); Limit hole (172); Fixing cylinder (173); Limit plate (174); Telescopic spring (175); Mounting cylinder (176); Limit cylinder (180); Inner cylinder (181); Upper cover assembly (200); Outer upper cover (210); Snap ring (211); Inner upper cover (220); Circuit board (230); Opening (240); Metal contact (250); Indicator light (260); Hinge structure (300); Annular spring groove (400); Support pad (500); Heat dissipation hole array (600); Battery (A).

DESCRIPTION OF EMBODIMENTS

The technical solution in the embodiment of the present disclosure will be clearly and completely described below with reference to the drawings. Obviously, the described embodiment is part of, rather than all of the embodiments of the present disclosure. The following description of at least one exemplary embodiment is illustrative in nature and is in no way intended to limit the present disclosure, its application or uses. Based on the embodiments in the present disclosure, all other embodiments obtained by those skilled in the art without creative work belong to the scope of protection of the present disclosure.

It should be noted that the terminology used here is only for describing specific embodiments, and is not intended to limit exemplary embodiments according to the present application. As used herein, the singular form is also intended to include the plural form unless the context clearly indicates otherwise. Furthermore, it should be appreciated that when the terms "comprising" and/or "including" are used in this specification, they specify the presence of features, steps, operations, devices, components and/or combinations thereof.

Unless otherwise specified, the relative arrangement of components and steps, numerical expressions and numerical values set forth in these embodiments do not limit the scope of the present disclosure. At the same time, it should be appreciated that for the convenience of description, the dimensions of various parts shown in the drawings are not drawn according to the actual scale relationship. Techniques, methods and equipment known to those skilled in the art may not be discussed in detail, but in appropriate cases, they should be regarded as part of the authorization specification. In all the examples shown and discussed herein, any specific values should be interpreted as illustrative, and not as limiting. Therefore, other examples of exemplary embodiments may have different values. It should be noted that similar numbers and letters indicate similar items in the following drawings, therefore once an item is defined in one drawing, it does not need to be further discussed in subsequent drawings.

A battery charger includes a lower cover assembly 100 (refer to FIG. 1), an upper cover assembly 200 (refer to FIG. 1), and a charging module.

The charging module adopts a modular partitioned layout, with one part installed inside the lower cover assembly 100 and another part installed inside the upper cover assembly 200.

Figure 5:
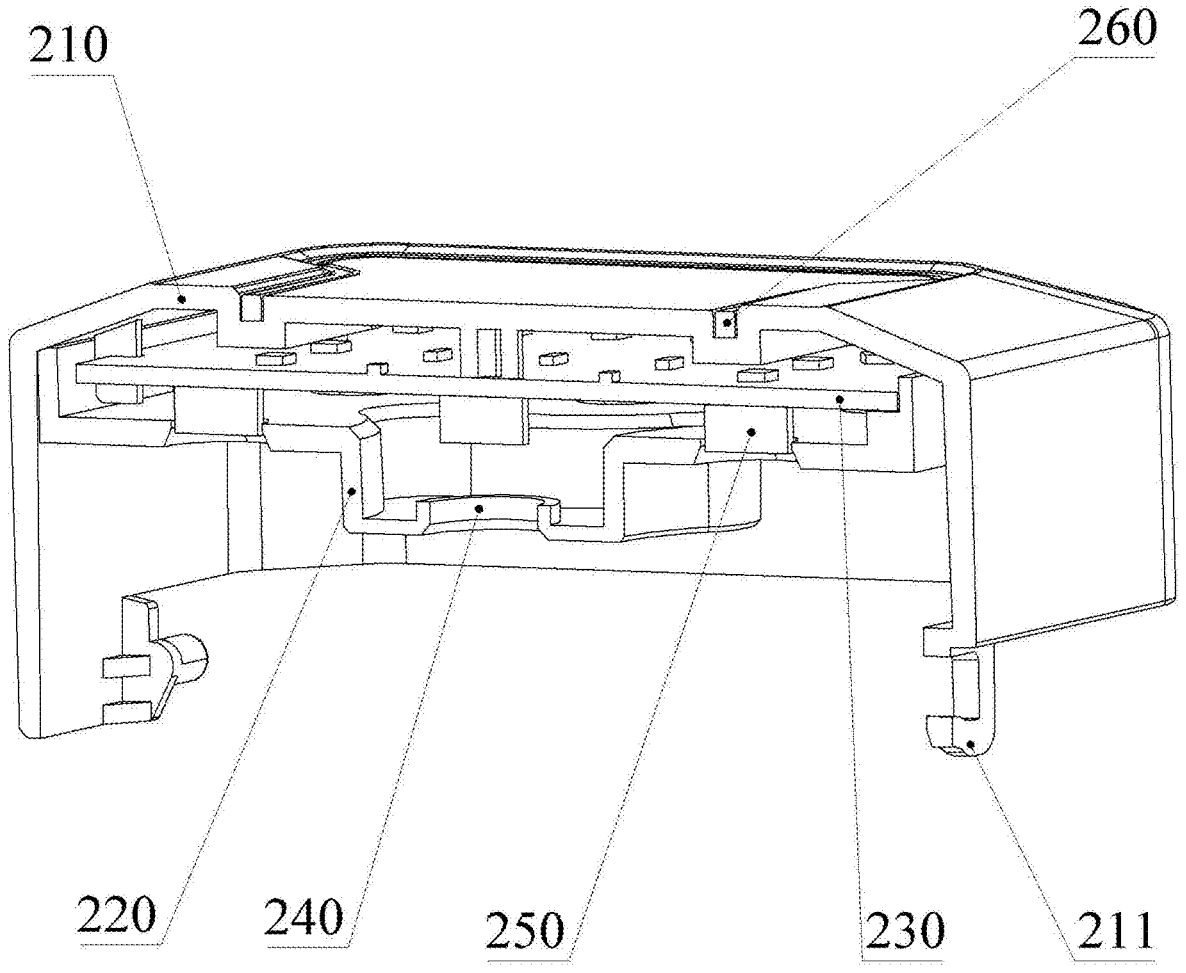
FIG. 5 is a perspective cross-sectional view of the upper cover assembly in the embodiment shown in FIG. 1.

In this embodiment, as shown in FIG. 5, the upper cover assembly 200 includes an outer upper cover 210 and an inner upper cover 220 fixedly installed inside the outer upper cover 210.

In other embodiments, the outer upper cover 210 and the inner upper cover 220 can be detachably installed. Detachable installation may employ snap-fit connections, magnetic adsorption, or other connection methods, facilitating separation of the outer upper cover 210 from the inner upper cover 220 when the inner upper cover 220 requires replacement, repair, cleaning, or adjustment for different usage needs. This design enhances the product's flexibility and maintainability.

Figure 7:
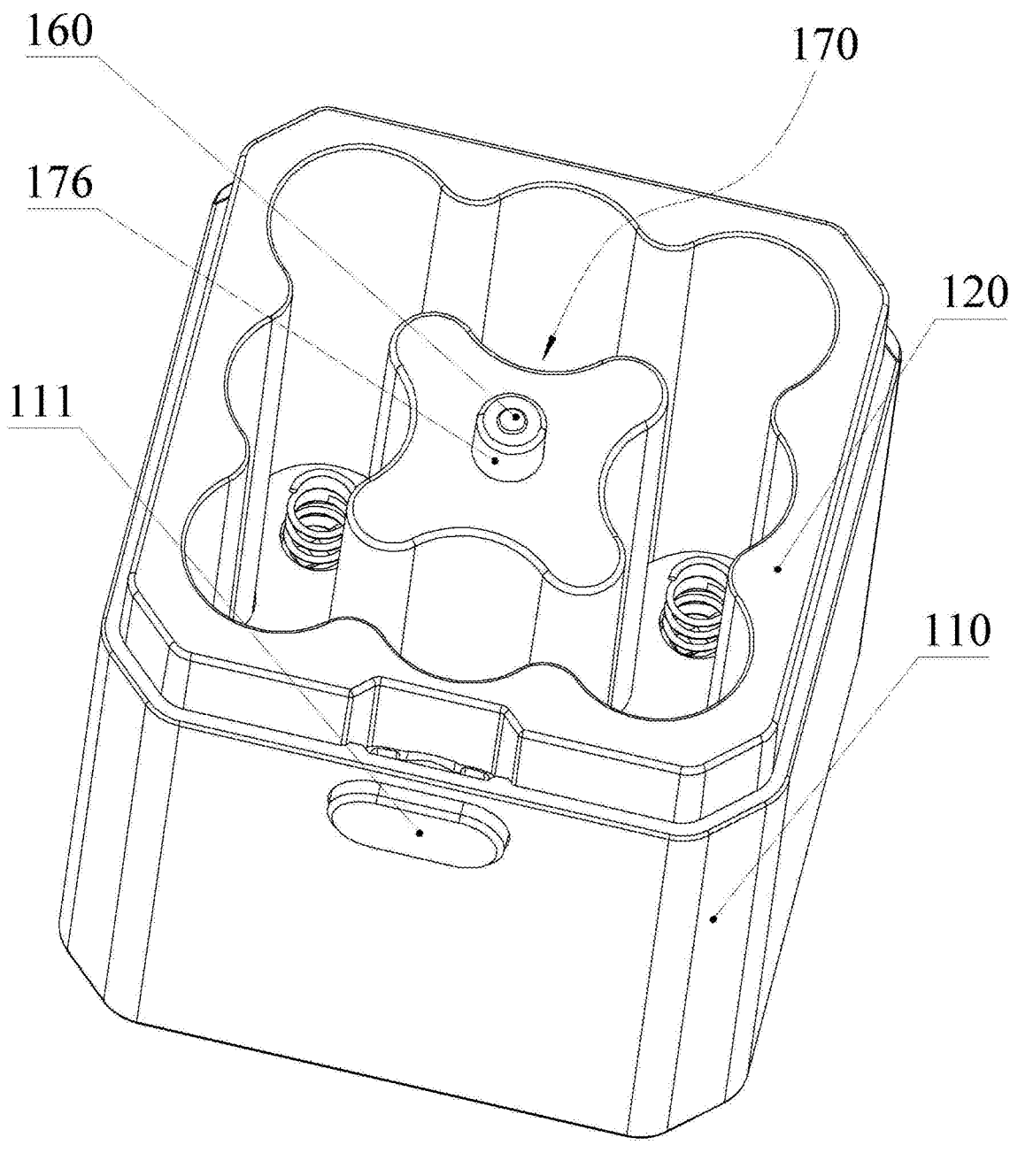
FIG. 7 is a schematic diagram of the internal structure of the base cover in the embodiment shown in FIG. 1.

In this embodiment, as shown in FIG. 7, the lower cover assembly 100 includes a base cover 110 and an inner base cover 120 fixedly installed inside the base cover 110.

In other embodiments, the base cover 110 and the inner base cover 120 can be disassembled and installed. The disassembly and installation can adopt connection methods such as snap-fit or magnetic adsorption, facilitating the separation of the two when the inner base cover 120 needs replacement, repair, cleaning, or adjustment according to different usage requirements. This design enhances the product's flexibility and maintainability. Meanwhile, a sliding groove can be arranged on the inner wall of the base cover 110, and a sliding block can be set on the outer sidewall of the inner base cover 120. Through the cooperation of the sliding groove and the sliding block, automatic alignment is achieved when the inner base cover 120 is installed inside the base cover 110, ensuring positional accuracy between components without manual fine-tuning and effectively preventing misalignment during installation.

Figure 4:
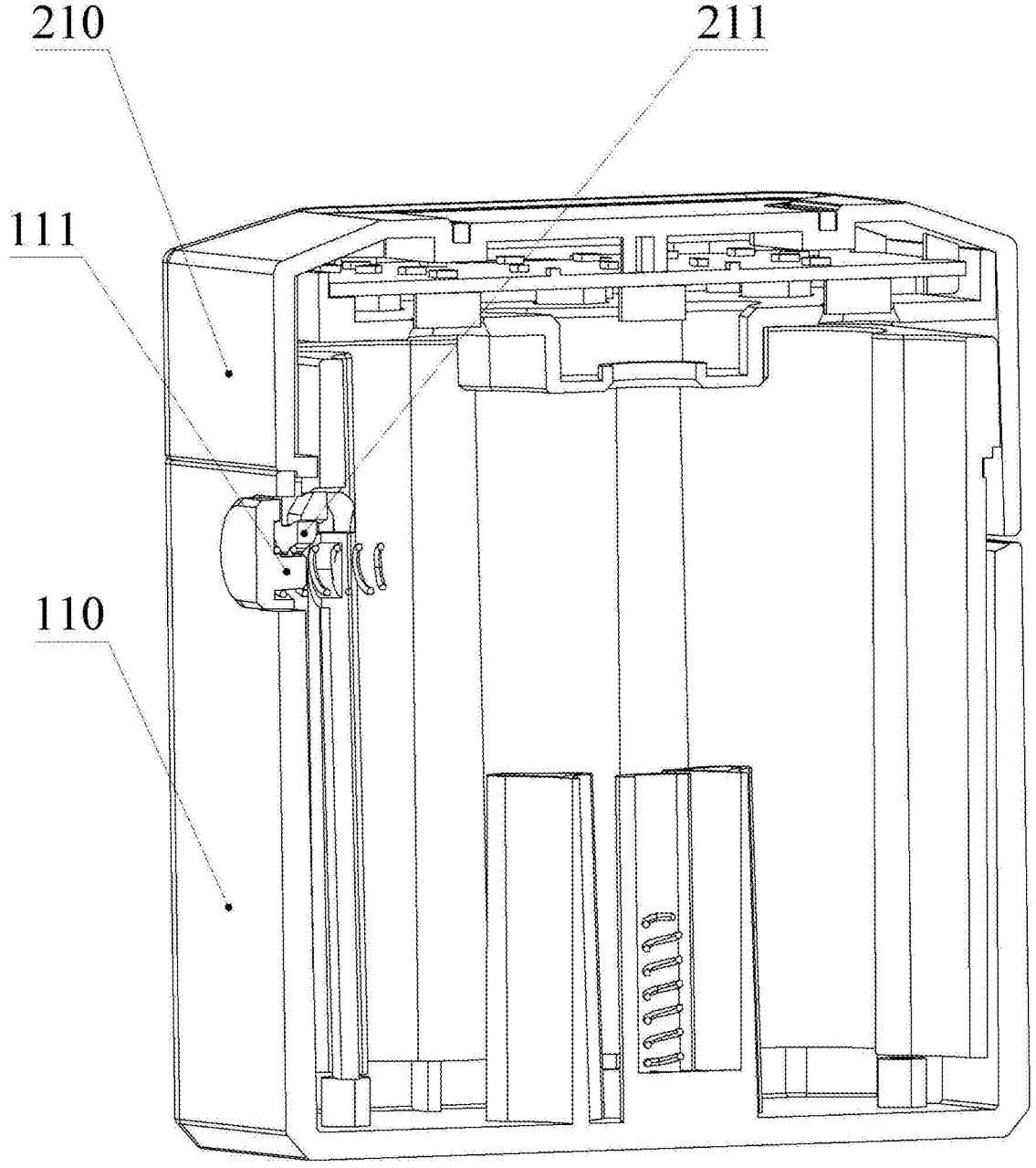
FIG. 4 is a schematic structural diagram of the spring-loaded cover button and snap-fit in the embodiment shown in FIG. 1.

In other embodiments, as shown in FIGS. 1 and 4, one side of the base cover 110 is equipped with a spring-loaded cover button 111, and the outer upper cover 210 is fixedly installed with a snap ring 211 on the same side as the spring-loaded cover button 111. Through the cooperation of the snap ring 211 and the spring-loaded cover button 111, the opening and closing of the outer upper cover 210 can be achieved.

In other embodiments (not shown), the snap ring 211 can be replaced with other structures, such as a snap block, as long as it can cooperate with the spring-loaded cover button 111 to enable the closing and opening of the outer upper cover 210.

Figure 2:
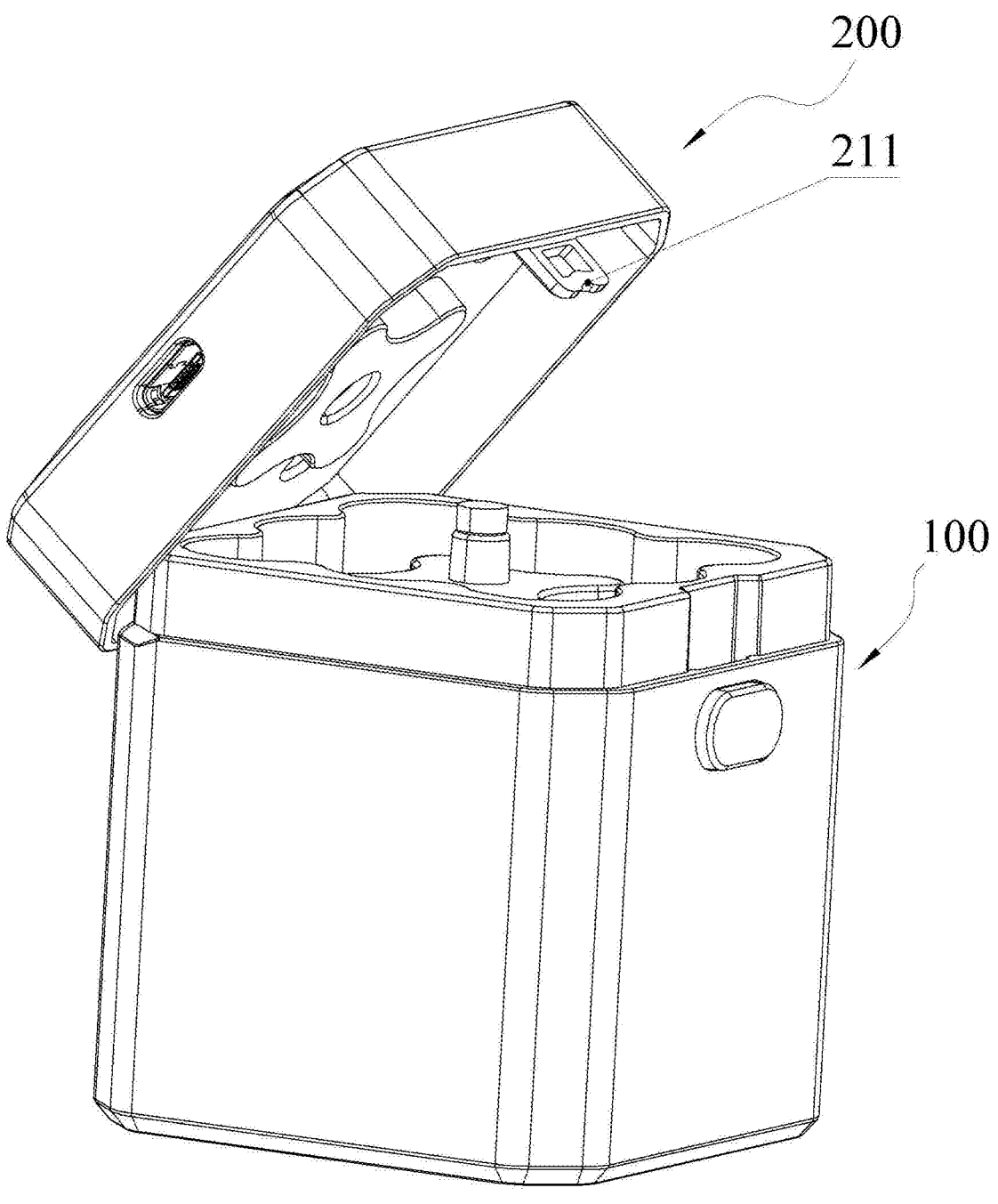
FIG. 2 is an open perspective schematic view of the embodiment in FIG. 1 without batteries.
Figure 3:
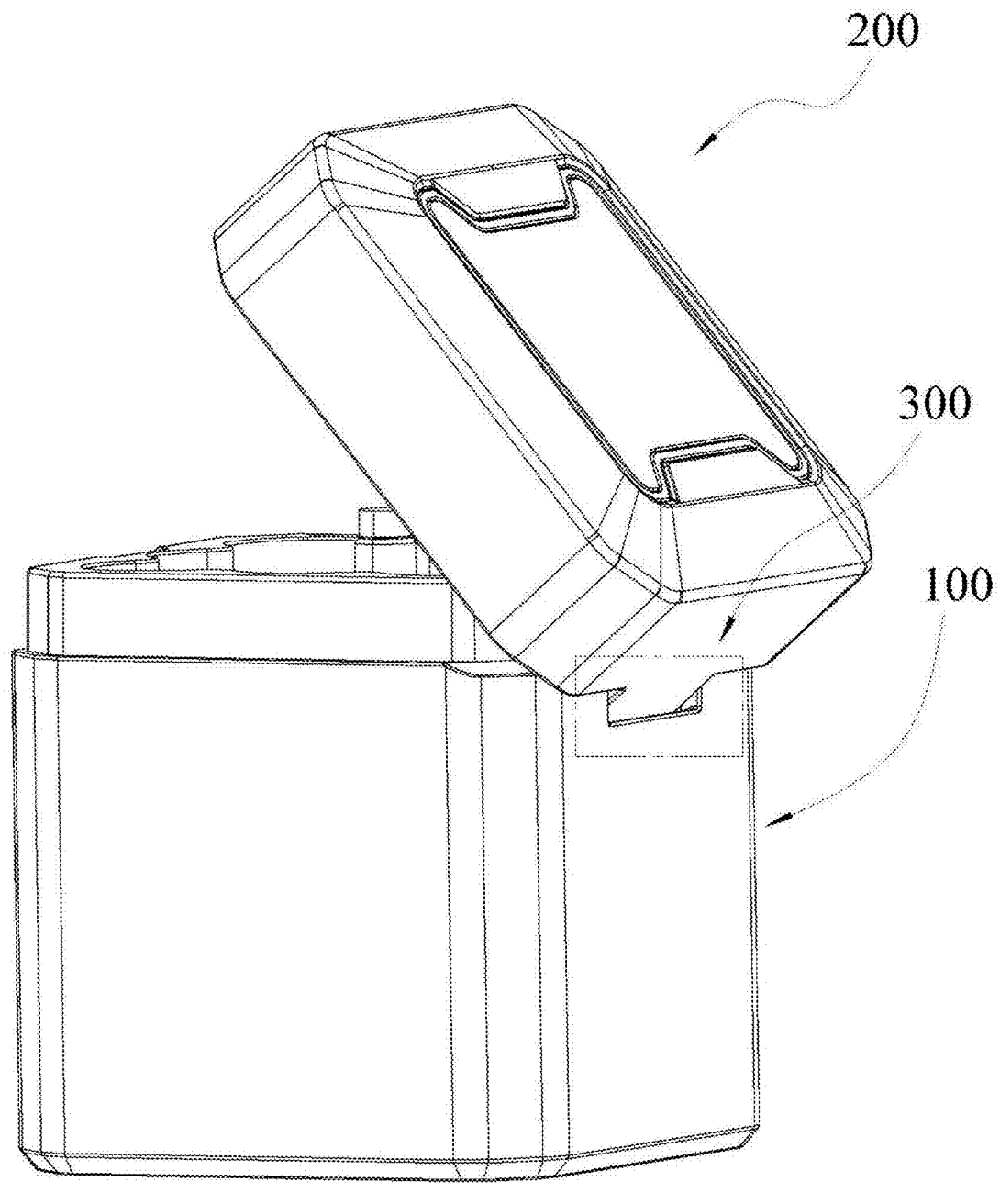
FIG. 3 is a schematic view of another angle of the embodiment in FIG. 2.

In other embodiments, as shown in FIGS. 2 and 3, a hinge structure is arranged on the side of the base cover 110 and the outer upper cover 210 away from the spring-loaded cover button 111. The base cover 110 and the outer upper cover 210 are connected via the hinge structure 300, enabling a flipping motion of the outer upper cover 210 along the hinge structure 300.

In other embodiments (not shown), the hinge structure 300 includes a rotating shaft installed on the base cover 110, while the outer upper cover 210 is equipped with a rotating sleeve that fits over the shaft. The rotating sleeve and the rotating shaft form a shaft-hole cooperation to enable the outer upper cover 210 to rotate around the shaft axis. The hinge structure 300 also includes hinges installed on the outer upper cover 210 and the base cover 110, facilitating the flipping motion of the outer upper cover 210.

Figure 6:
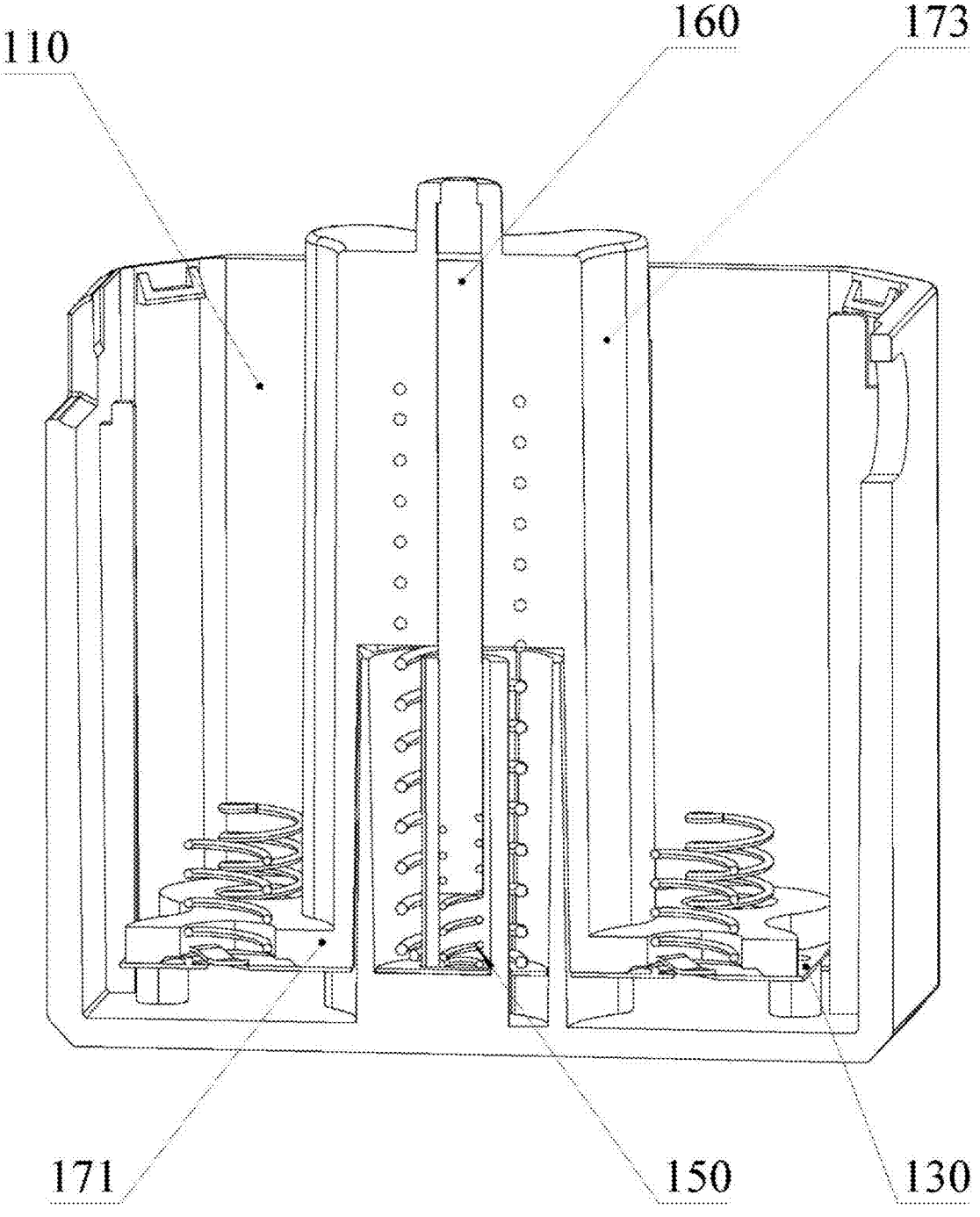
FIG. 6 is a perspective cross-sectional view of the base cover in the embodiment shown in FIG. 1.
Figure 9:
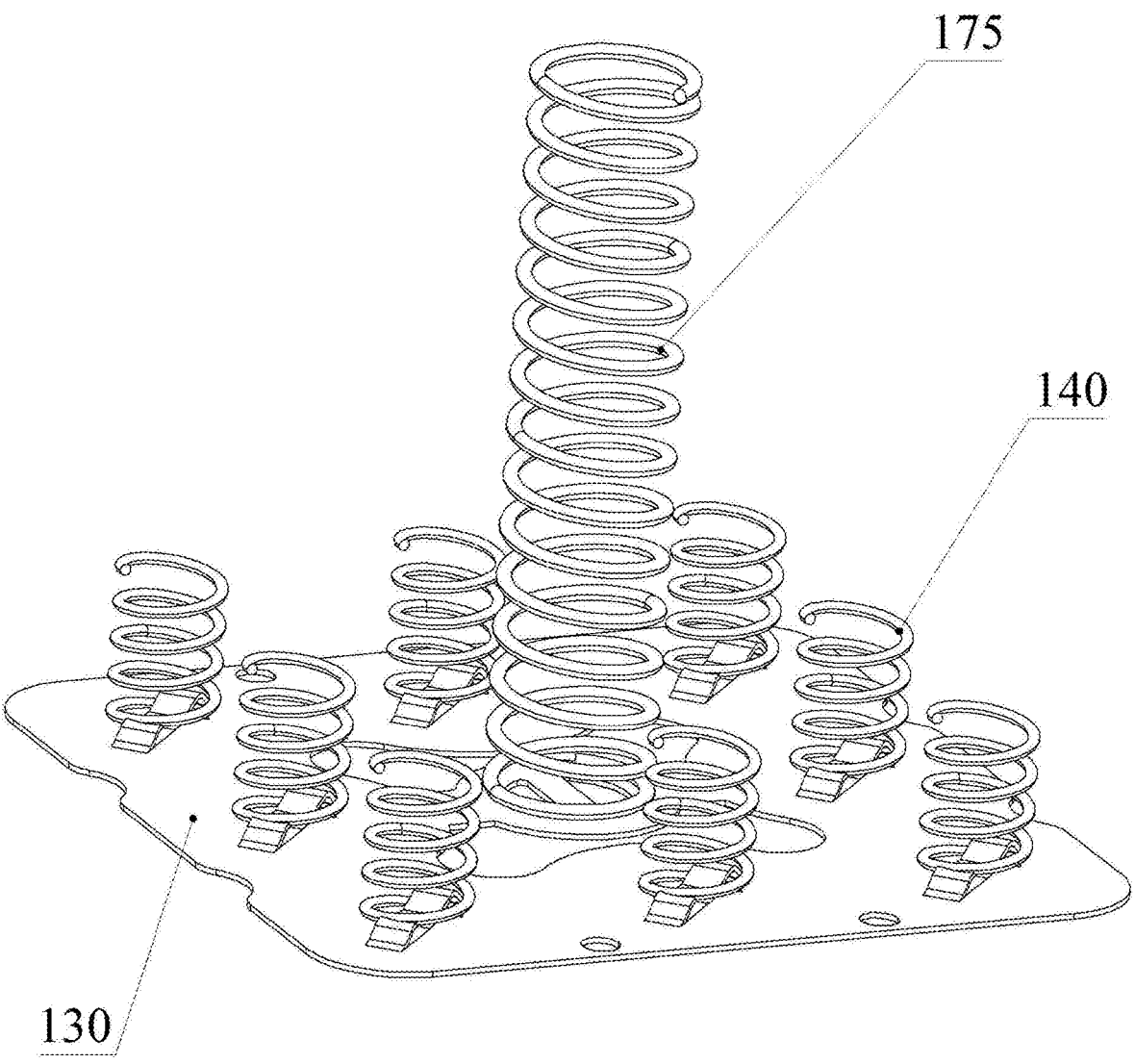
FIG. 9 is a schematic structural diagram of the electrode plate in the embodiment shown in FIG. 1.
Figure 12:
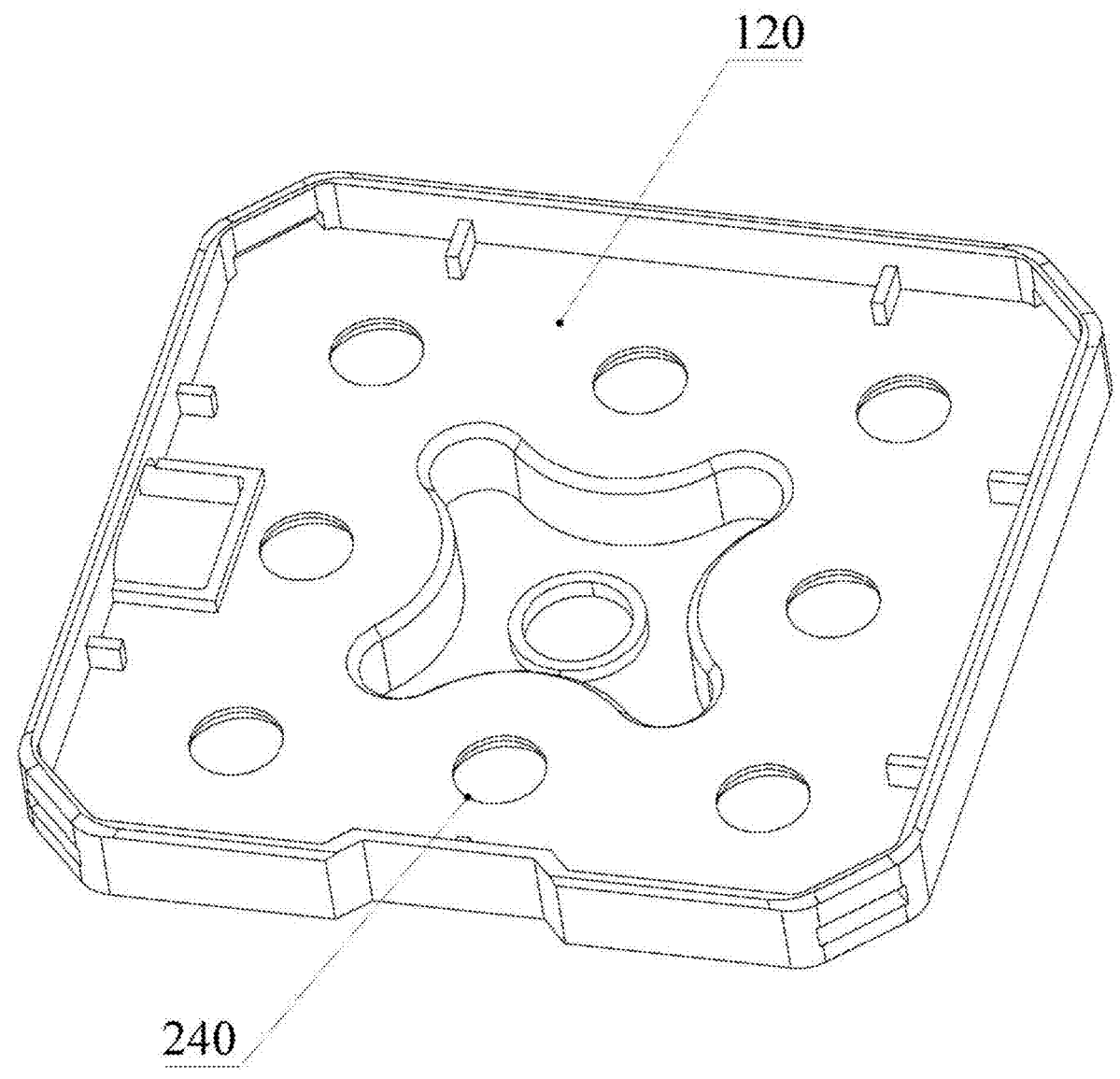
FIG. 12 is a schematic structural diagram of the inner upper cover in the embodiment shown in FIG. 1.

In this embodiment, as shown in FIGS. 6 and 9, the charging module includes an electrode plate 130 installed on the inner wall of the base cover 110. Contact springs 140 are circumferentially arranged on the top of the electrode plate 130. As shown in FIG. 6, a compression spring 150 is fixed at the center of the electrode plate 130, and a fixing rod 160 is fixed at the top of the compression spring 150. As shown in FIGS. 5 and 12, the charging module also includes a circuit board 230 installed inside the inner upper cover 220. The lower surface of the circuit board 230 is equipped with a plurality of metal contacts 250, arranged in a symmetrical nine-square grid pattern. Openings 240 are provided on the inner upper cover 220 directly below multiple metal contacts 250.

The batteries are arranged in a circumferential array inside the base cover 110, with the negative terminals of all batteries in contact with the contact spring 140, and the positive terminals passing through the opening 240 to contact the corresponding metal contacts 250. When the outer upper cover 210 is closed, the fixing rod 160 passes through the opening 240 at the center of the inner upper cover 220 and contacts the metal contacts 250. During this process, as shown in FIG. 14, a circuit, from the circuit board 230 to the metal contact 250, to the positive electrode, to the contact spring 140, to the electrode plate 130, to the compression spring 150, to the fixing rod 160, back to the metal contacts 250, and finally to the circuit board 230, is formed inside the charger, enabling efficient battery charging.

In other embodiments (not shown), the contact spring 140 is omitted, and a plurality of protrusions are provided on the electrode plate 130 to serve as a replacement for the contact spring 140.

In other embodiments (not shown), the metal contacts 250 are omitted, and a plurality of springs are provided at the bottom of the circuit board 230 to serve as a replacement for the metal contacts 250.

Figure 14:
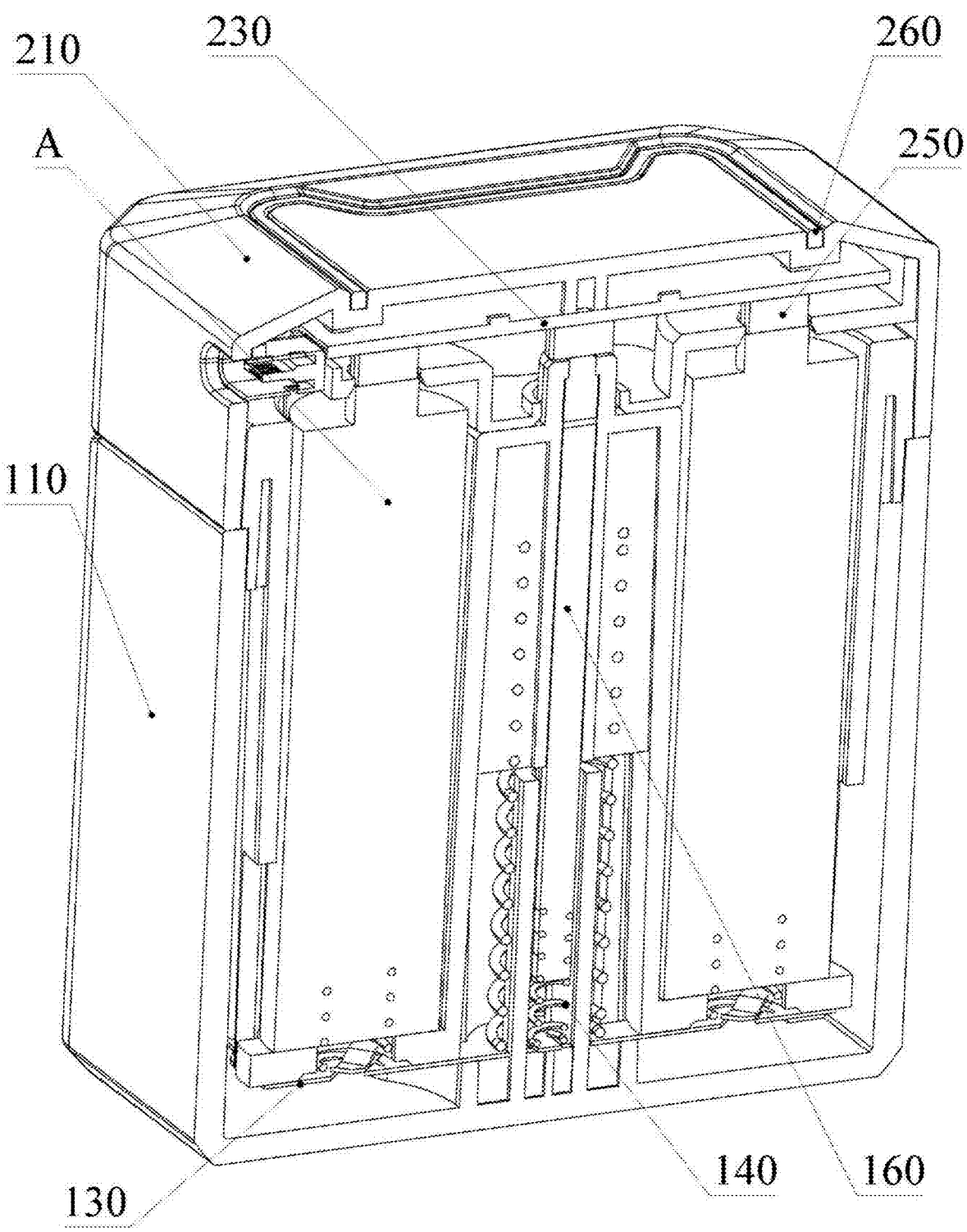
FIG. 14 is a perspective cross-sectional view of the embodiment shown in FIG. 1.

As shown in FIG. 14, when the outer upper cover 210 is closed, the metal contacts 250 contact the fixing rod 160, converting the closing motion of the outer upper cover 210 into a vertically downward force on the fixing rod 160, forcing it to move axially downward. During this process, the displacement of the fixing rod 160 directly acts on the compression spring 150, gradually compressing it. When the fixing rod 160 reaches its lowest position, the compression spring 150 achieves maximum compression, storing elastic potential energy that exerts an upward force on the fixing rod 160, balancing the downward pressure from the metal contact 250, thereby maintaining the fixed rod 160 in a balanced state, preventing its movement and consequently securing it in a stationary fixed position. When the outer upper cover 210 is opened, the metal contacts 250 no longer press the fixing rod 160, allowing the compression spring 150 to expand and release its stored energy, pushing the fixing rod

160 upward. This motion drives the metal contact 250 to move upward, consequently pushing the upper cover 210 to flip. Through the aforementioned operations, operator is relieved from manually flipping the upper cover 210, thereby realizing the automated flipping function of the upper cover 210.

In other embodiments (not shown), a plurality of support columns are fixed to the inner bottom wall of the inner upper cover 220, with the circuit board 230 mounted on the support columns. These support columns distribute the force on the circuit board 230 through multi-point contact, preventing deformation of the circuit board 230 during frequent opening and closing of the cover.

In other embodiments (not shown), a plurality of threaded sleeves are fixed on the inner bottom wall of the base cover 110, and a plurality of openings corresponding to the positions of the threaded sleeves are provided on the electrode plate 130, allowing the electrode plate 130 to be detachably installed inside the base cover 110 via bolts. At the same time, the threaded sleeves can support the electrode plate 130, preventing the electrode plate 130 from breaking due to excessive load. Additionally, the electrode plate 130 can adopt other detachable connection methods, such as snap-fit or magnetic connections.

In other embodiments (not shown), a miniature universal joint structure is integrated on the surface of the electrode plate 130, giving the contact spring 140 a certain adaptive deflection capability. When there is slight misalignment between the battery positive terminal and the opening 240, the spring contact can automatically adjust its angle to ensure reliable contact, improving compatibility with irregularly shaped batteries.

In other embodiments (not shown), a groove is provided on one side of the outer upper cover 210, inside which a charging interface can be installed and connected to the circuit board 230 to supply power. Additionally, a solar charging panel can be placed on the top of the outer upper cover 210 and wired to the circuit board 230. By incorporating the solar panel, the charger gains in-situ energy capture capability, forming a self-sustaining energy solution for outdoor use scenarios and enhancing operational stability in environments without fixed power sources.

In other embodiments (not shown), a ring-shaped magnet array is embedded inside the metal contact 250. When the battery is mistakenly installed with its positive terminal facing downward, the repulsive force between like poles provides tactile feedback, allowing the operator to quickly correct the battery orientation.

In this embodiment, as shown in FIG. 7, a battery bracket 170 is installed inside the base cover 110. As shown in FIG. 6, the battery bracket 170 includes a mounting plate 171 positioned on top of the electrode plate 130. The center of the mounting plate 171 is hollow, and limit holes 172 are provided on its surface directly above the contact spring 140. The diameter of the limit holes 172 is larger than that of the contact spring 140 but smaller than that of the battery.

The configuration of the diameter of the limit holes 172 ensures that when the battery is placed on top of the mounting plate 171, it cannot pass through the limit holes 172, allowing the mounting plate 171 to support the battery while the contact spring 140 can extend through the limit holes 172 to contact the bottom of the battery.

Figure 10:
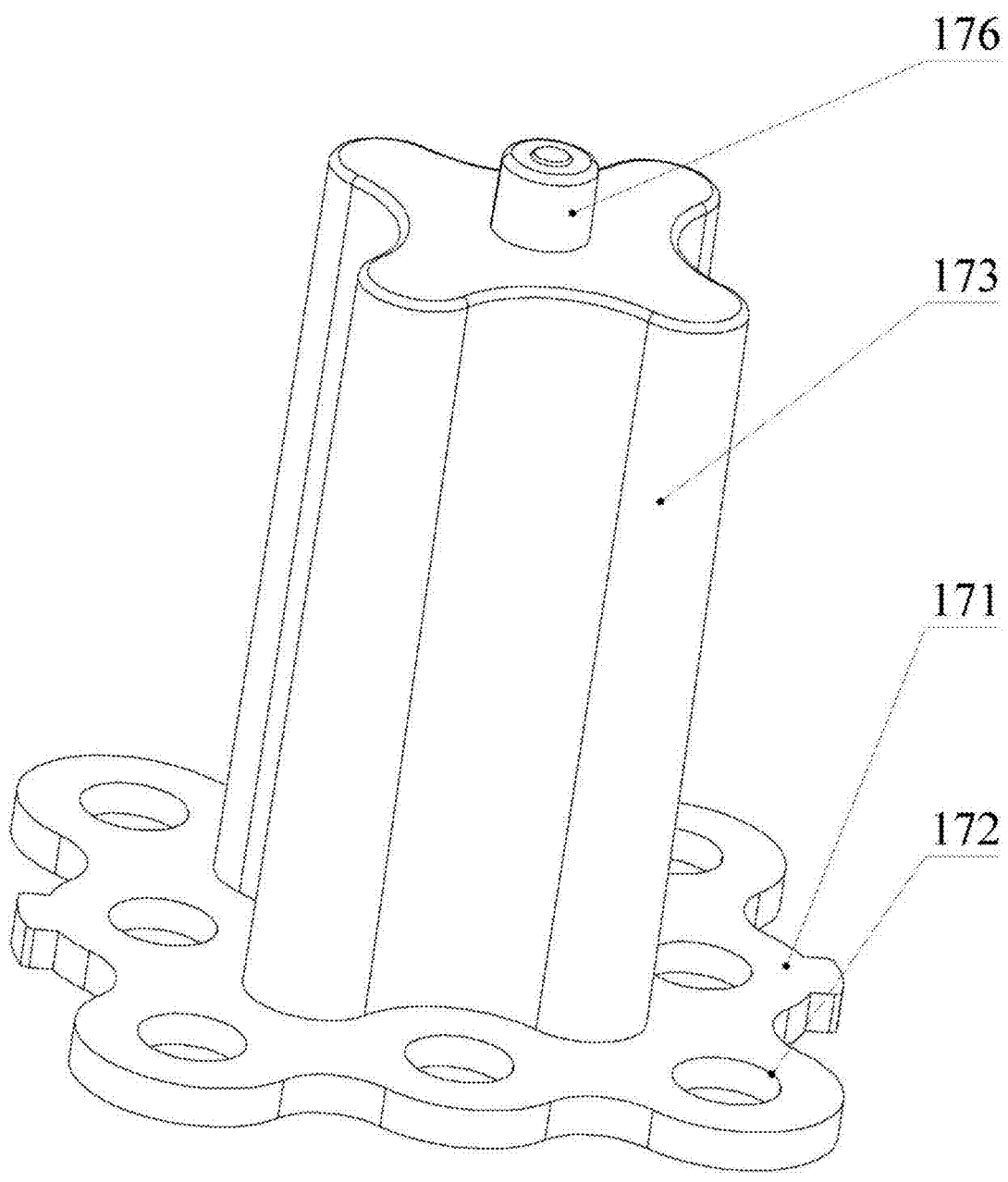
FIG. 10 is a schematic structural diagram of the battery bracket in the embodiment shown in FIG. 1.

In other embodiments, as shown in FIG. 10, the side walls of the mounting plate 171 are symmetrically equipped with guide bosses. These protrusions provide contact constraints for the mounting plate 171, creating a balanced sliding guide surface during axial displacement of the mounting plate 171, effectively suppressing deflection and improving motion trajectory accuracy. Additionally, a plurality of protrusions can be arranged in an array around the side walls of the mounting plate 171.

In other embodiments (not shown), the contact spring 140 can be replaced with sidewall elastic clamps, which achieve contact with the battery through lateral compression when the mounting plate 171 moves downward, eliminating the need for a limit hole 172 on the mounting plate 171. Furthermore, the contact spring 140 structure can be omitted by integrating a wireless charging coil within the mounting plate 171, enabling battery charging. A plurality of wireless charging coils can also be installed on the mounting plate 171 to charge a plurality of batteries simultaneously.

In other embodiments, as shown in FIGS. 7 and 10, the inner wall at the center of the mounting plate 171 is fixed with a fixing cylinder 173. As illustrated in FIG. 7, the side walls of the fixing cylinder 173 are curved, while the inner wall of the inner base cover 120 is wave-shaped. The combination of the wave-shaped inner wall and the curved side walls achieves adaptive fixation of the battery through multi-point contact, ensuring the battery is securely placed within the base cover 110.

In other embodiments (not shown), a hinge and cable traction mechanism can be used between the fixing cylinder 173 and the mounting plate 171, allowing for a non-rigid connection between the fixing cylinder 173 and the mounting plate 171. The fixing cylinder 173 can also be split into upper and lower segments, with power transmission achieved via a rack-and-pinion mechanism, enabling a modular setup of the fixing cylinder 173.

Figure 11:
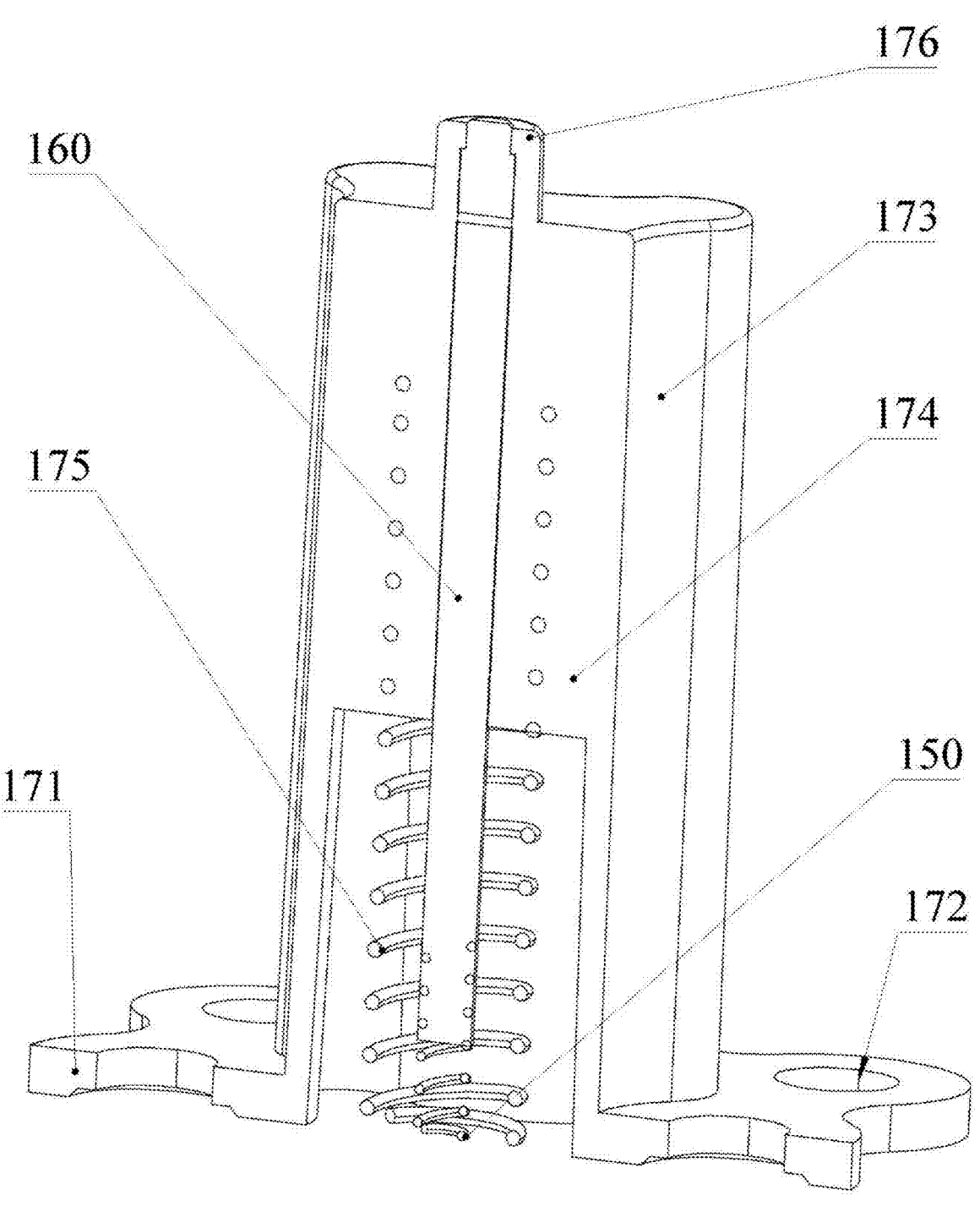
FIG. 11 is a perspective cross-sectional view of the battery bracket in the embodiment shown in FIG. 10.

In other embodiments, as shown in FIG. 11, the bottom of the fixing cylinder 173 is open and a vertically extending chamber is contained inside. The top of the fixing cylinder 173 is inserted with a mounting cylinder 176, part of which resides inside the chamber. The fixing rod 160 is movably inserted into the mounting cylinder 176, and the surface of the mounting cylinder 176 is fixed with a limit plate 174 connected to the inner wall of the fixing cylinder 173. The lower surface of the limit plate 174 is fixed with a telescopic spring 175, the other end of which is connected to the top of the electrode plate 130. The fixing rod 160 is located inside the telescopic spring 175, and the central area of the inner upper cover 220 is recessed downward to contact the top of the fixing cylinder 173.

Figure 13:
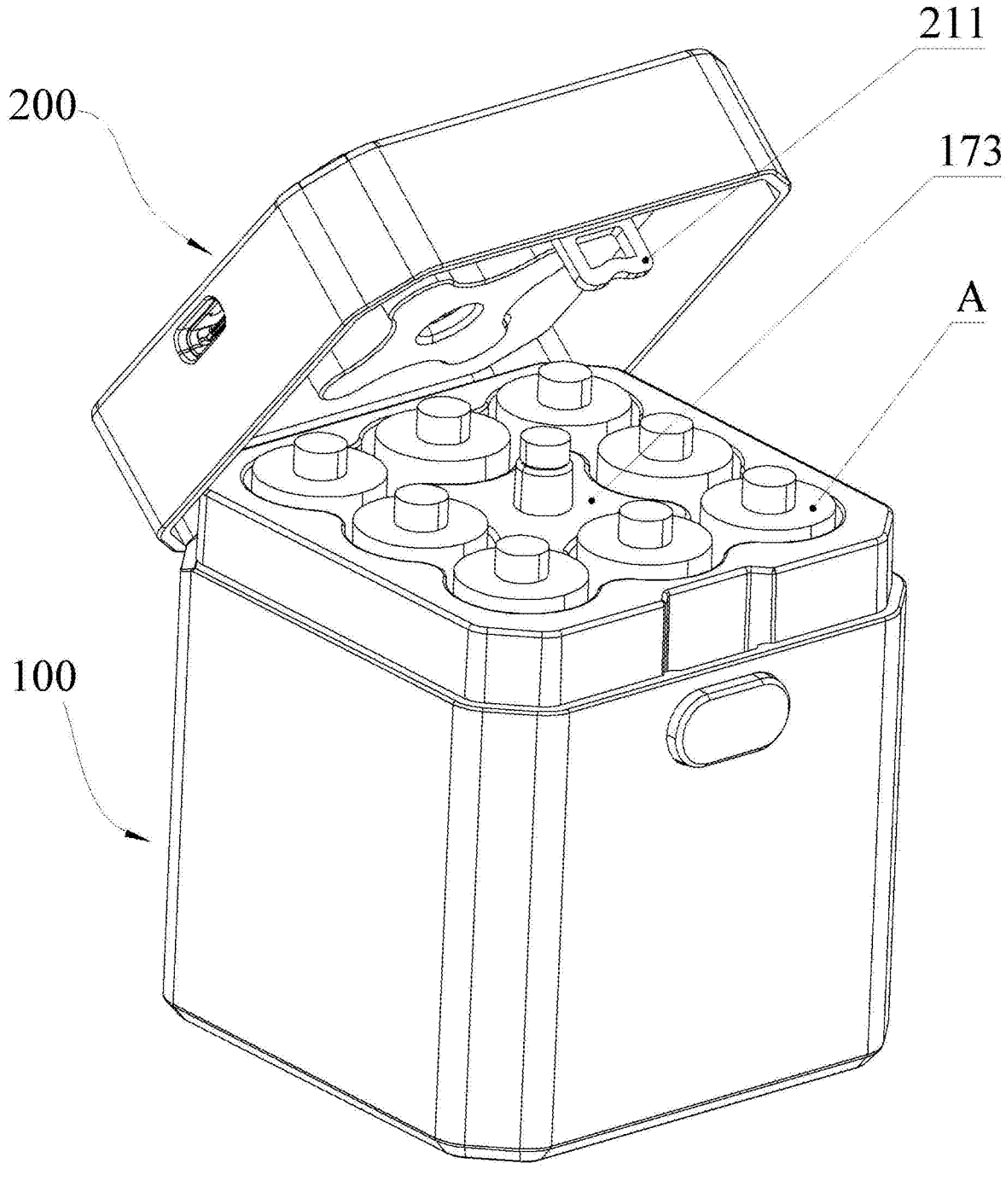
FIG. 13 is a perspective schematic diagram of the embodiment shown in FIG. 1 when opened with a battery installed.

When the outer upper cover 210 is closed, the recessed portion of the inner upper cover 220 contacts the top of the fixing cylinder 173 and applies downward pressure, causing the entire battery bracket 170 to move downward and subsequently driving the battery downward. When the outer upper cover 210 is opened, the inner upper cover 220 releases the pressure on the fixing cylinder 173, allowing the fixing cylinder 173 to move upward under the elastic potential energy of the telescopic spring 175. This synchronously lifts the mounting plate 171, driving the battery upward until its top rises above the top of the inner base cover 120 (as shown in FIG. 13), facilitating the removal of the battery by the operator.

Figure 16:
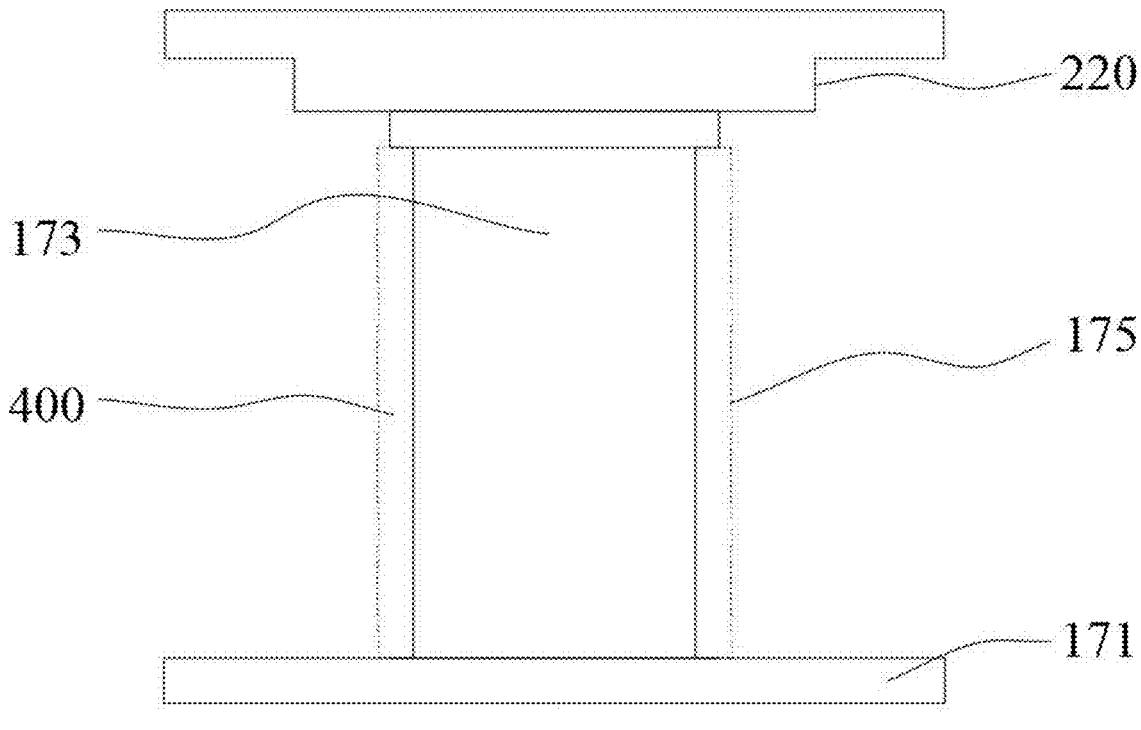
FIG. 16 is a schematic diagram of the fixing cylinder and telescopic spring in another embodiment provided by the present disclosure.

In other embodiments, as shown in FIG. 16, no chamber is internally formed in the fixing cylinder 173. Instead, an annular spring groove 400 is provided externally on the fixing cylinder 173, with the telescopic spring 175 fitted around the outer surface of the fixing cylinder 173 via the annular spring groove 400. Compression of the spring is achieved through the fitting between the outer wall of the fixing cylinder 173 and the bottom of the inner upper cover 220 (similar to the design of an automotive piston).

In other embodiments (not shown), the edge of the opening in the inner base cover 120 is designed with a slope. Even if the top of the battery does not protrude beyond the plane, the battery can still be inserted or removed via the inclined angle. Additionally, a micro air pump can be installed at the top of the mounting plate 171 along the edge of the limit hole 172. When activated, it briefly emits air to eject the battery beyond the opening plane of the inner base cover 120.

In other embodiments (not shown), the telescopic spring 175 can be replaced with a pneumatic device. The piston movement is driven by air pressure changes when the upper cover assembly 200 is closed, achieving energy storage and release functions.

In other embodiments (not shown), a lever transmission mechanism is added between the fixing cylinder 173 and the inner upper cover 220. When the upper cover assembly 200 is closed, the lever is pressed to indirectly push the fixing cylinder 173 downward. Alternatively, an electromagnet and magnetic bracket assembly can be installed, generating magnetic attraction when the upper cover assembly 200 is closed to drive the fixing cylinder 173 downward.

In other embodiments (not shown), a screw-lift device driven by an independent motor is installed below the mounting plate 171. The motor is triggered by the opening signal of the upper cover assembly 200 to lift the mounting plate 171. Additionally, permanent magnets with like poles facing each other can be installed between the mounting plate 171 and the lower cover assembly 100, utilizing magnetic repulsion for lifting and eliminating the need for a spring structure.

Figure 8:
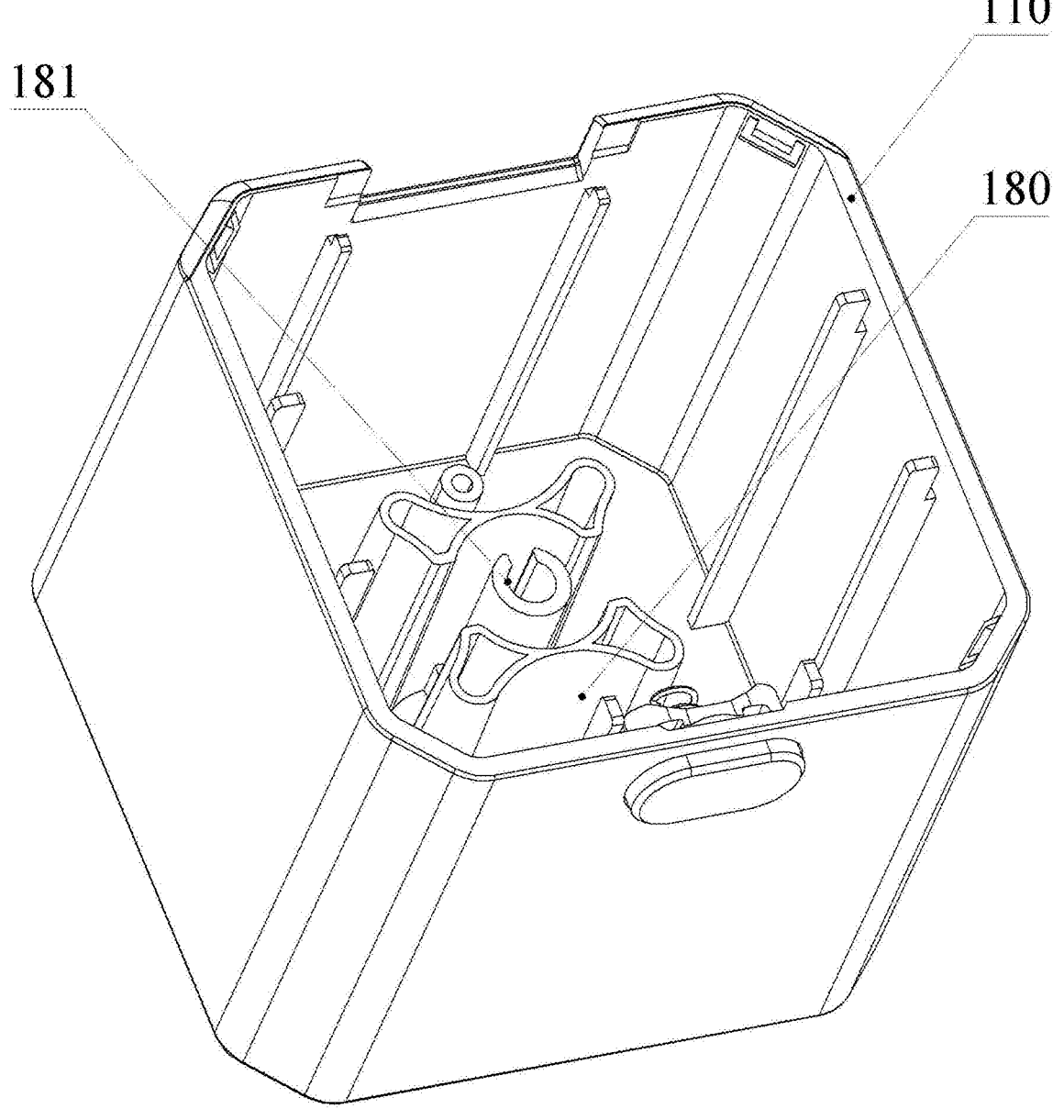
FIG. 8 is another schematic diagram of the internal structure of the base cover in the embodiment shown in FIG. 7.

In this embodiment, as shown in FIGS. 6 and 8, a limit cylinder 180 is fixedly installed on the inner bottom wall of the base cover 110. An inner cylinder 181 is arranged inside the limit cylinder 180. Both the limit cylinder 180 and the inner cylinder 181 pass through the electrode plate 130 and are located inside the fixing cylinder 173. The compression spring 150 and the fixing rod 160 are positioned inside the inner cylinder 181, while the telescopic spring 175 is located inside the limit cylinder 180 and sleeved on the surface of the inner cylinder 181. By incorporating the inner cylinder 181, not only is the compression spring 150 protected from bending deformation, but the fixing rod 160 is also guided and limited, preventing displacement of the fixing rod 160. The limit cylinder 180 safeguards the telescopic spring 175. Moreover, when the fixing cylinder 173 is driven downward by the inner upper cover 220, rigid contact between the limit plate 174 and the bottom of the limit cylinder 180 forms a hard stop, precisely locking the movement endpoint to prevent mechanism jamming or plastic deformation of connectors due to overshooting.

In this embodiment, as shown in FIGS. 5 and 14, an indicator light 260 is fixedly installed on the top of the outer upper cover 210. The inclusion of the indicator light 260 allows staff to intuitively monitor the battery's charging status.

In other embodiments (not shown), the indicator light 260 can be directly installed on top of the circuit board 230, while an observation port can be opened on the top of the outer upper cover 210, with an observation window fixed to its inner wall. By mounting the indicator light 260 on the circuit board 230, the indicator light 260 remains inside the outer upper cover 210, facilitating protection for the indicator light 260. The observation window enables the operator to check the illumination status of the indicator light 260. Additionally, a photosensor integrated inside the observation window automatically reduces the brightness of the indicator light 260 to below 10% upon detecting a persistently dark environment (e.g., nighttime), while activating silent charging mode to eliminate light pollution and noise interference.

In other embodiments (not shown), a replaceable magnetic identifier plate is designed on the surface of the inner upper cover 220, distinguishing charging zone functions (e.g., fast-charging zone, maintenance-charging zone) via different colors/patterns. The identifier plate contains an embedded NFC chip; touching it with a phone displays the charging parameters for that zone.

Figure 15:
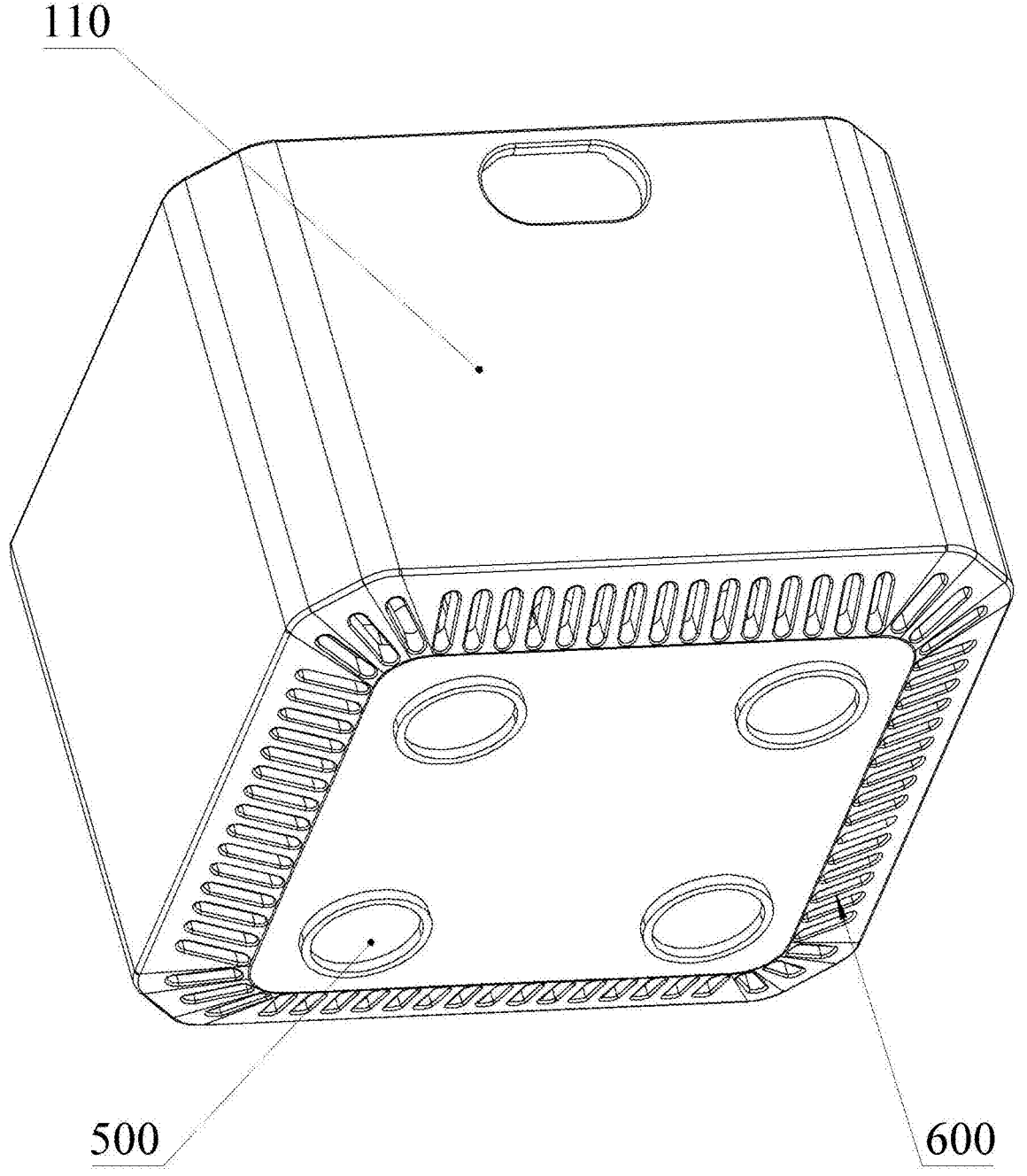
FIG. 15 is a schematic structural diagram of the base cover in another embodiment provided by the present disclosure.

In other embodiments, as shown in FIG. 15, the bottom of the base cover 110 is circumferentially distributed with several support pads 500. Their height is designed to effectively elevate the gap between the base cover 110 and the contact surface, as well as the gap between the bottom of the base cover 110 and the ground. This can effectively reduce direct contact of ground moisture and dust with the bottom of the device while forming an air circulation channel at the bottom. Simultaneously, the heat dissipation hole array 600, arranged in a ring pattern on the outer side of the support pads 500, works in synergy with the layout of the support pads 500 to promote air convection inside and outside the device while ensuring structural stability. The annular hole array forms a three-dimensional heat dissipation path, accelerating heat diffusion from the electrode working area outward, thereby effectively reducing the temperature inside the base cover 110. Additionally, the support pads 500 can be made of elastic materials (such as rubber), giving the support pads 500 a certain elasticity that allows the support pads 500 to absorb mechanical vibrations during device operation, reducing operational noise.

In summary, as can be seen from the above description, the present disclosure achieves the following technical effects: the battery is placed inside the base cover 110, with its bottom in contact with the top of the mounting plate 171, allowing the mounting plate 171 to support the battery; after placing a plurality of batteries, the operator closes the outer upper cover 210, which is then limited under the action of the spring-loaded cover button 111; simultaneously, the inner upper cover 220 pushes the battery bracket 170 downward, causing the battery bracket 170 to move the battery downward; at this point, the battery comes into contact with the contact spring 140, forming a charging circuit and initiating battery charging; once charging is complete, the spring-loaded cover button 111 is pressed to release the restriction on the outer upper cover 210; the fixing rod 160 moves upward under the action of the compression spring 150, driving the metal contact 250 upward and flipping the outer upper cover 210 open completely; when the outer upper cover 210 is fully opened, the inner upper cover 220 releases the pressure on the fixing cylinder 173, allowing the fixing cylinder 173 to move upward under the elastic potential energy of the telescopic spring 175, which causes the mounting plate 171 to move upward synchronously, lifting the battery so that the top of the battery rises above the top of the inner base cover 120, making it convenient for the operator to remove the battery for use.

In the description of the present disclosure, it should be appreciated that directional terms such as "front, rear, up, down, left, right", "horizontal, vertical, perpendicular, horizontal" and "top, bottom" etc. indicate the orientation or positional relationship based on the orientation or positional relationship shown in the drawings, and are only for the convenience of describing the present disclosure and simplifying the description. In the absence of a contrary explanation, these directional terms do not indicate or imply that the device or element referred to must have a specific orientation or be constructed and operated in a specific orientation, and therefore should not be understood as limiting the scope of protection of the present disclosure; the directional terms "inside, outside" refer to the inside and outside relative to the contour of each component itself.

For the convenience of description, spatial relative terms such as "on . . . ", "above . . . ", "on the upper surface of . . . ", "upper" etc. may be used here to describe the spatial positional relationship of a device or feature with other devices or features as shown in the drawings. It should be appreciated that spatial relative terms are intended to encompass different orientations of the device in use or operation other than the orientation described in the drawings. For example, if the device in the drawing is inverted, the device described as "above other devices or structures" or "on other devices or structures" will subsequently be positioned as "below other devices or structures" or "under other devices or structures". Thus, the exemplary term "above" can include both "above" and "below" orientations. The device can also be positioned in other different ways (rotated 90 degrees or in other orientations), and the spatial relative descriptions used here should be interpreted accordingly.

In addition, it should be noted that the use of terms such as "first", "second" etc. to define components is for the convenience of distinguishing the corresponding components. Unless otherwise stated, the above terms have no special meaning, and therefore should not be understood as limiting the scope of protection of the present disclosure.

The above description is only a preferred embodiment of the present disclosure and is not intended to limit the present disclosure. For those skilled in the art, the present disclosure can have various modifications and changes. Any modifications, equivalent replacements, improvements etc. made within the spirit and principles of the present disclosure should be included within the scope of protection of the present disclosure.

What is claimed is:

1. A battery charger, comprising:
   a housing, formed by an upper cover assembly and a lower cover assembly configured with an openable and closable connecting mechanism, wherein the lower cover assembly is provided with a battery compartment; and
   a charging module, comprising a multi-contact electrode assembly disposed in the lower cover assembly and a circuit control assembly disposed in the upper cover assembly, wherein the circuit control assembly is provided with a battery electrode connection terminal, and the multi-contact electrode assembly forms another battery electrode connection terminal through a contact spring; and
   a liftable battery carrier mechanism, comprising:
   a substrate axially displaceably installed in the battery compartment, carrying a battery and provided with a limit through-hole corresponding to the contact spring; and
   a push rod fixedly connected to a mounting substrate and having an axially extending chamber inside; and
   a resilient energy storage unit disposed in the chamber, with a bottom end thereof abutting the lower cover assembly; and
   wherein, in a case where the upper cover assembly is closed, the circuit control assembly abuts a top of the push rod and presses the push rod downward, causing the resilient energy storage unit to store energy, while driving the mounting substrate downward to allow the contact spring to pass through the limit through-hole, establishing a circuit for charging the battery; and in a case where the upper cover assembly is opened, the resilient energy storage unit releases an elastic force to drive the push rod upward, lifting the mounting substrate so that a top of the battery rises above a lowest opening plane of the lower cover assembly.

2. The battery charger according to claim 1, wherein the upper cover assembly comprises an outer upper cover and an inner upper cover disposed inside the outer upper cover.

3. The battery charger according to claim 2, wherein the circuit control assembly comprises a circuit board disposed inside the inner upper cover, a lower surface of the circuit board being provided with a plurality of metal contacts arranged in a symmetrical nine-square grid pattern.

4. The battery charger according to claim 3, wherein the multi-contact electrode assembly comprises an electrode plate arranged on an inner wall of a base cover, there are a plurality of contact springs that are circumferentially arrayed on a top of the electrode plate, and a compression spring is fixed at a center of the electrode plate, wherein a top of the compression spring is fixedly equipped with a fixing rod, and when the upper cover assembly is closed, a top end of the fixing rod contacts the plurality of metal contacts at a center of the circuit board.

5. The battery charger according to claim 4, wherein the inner upper cover is provided with openings directly below the plurality of metal contacts, and the openings allow one pole of the battery and the fixing rod to pass through the inner upper cover and be connected with the plurality of metal contacts.

6. The battery charger according to claim 4, wherein the liftable battery carrier mechanism is a battery bracket; and the substrate is a mounting plate, which is arranged on the top of the electrode plate, and a center of the mounting plate is a hollow structure; and the limit through-hole is a limit hole, a diameter of which is larger than that of the contact spring but smaller than that of the battery, allowing the contact spring to pass through the limit hole; and the push rod is a fixing cylinder, which is fixedly installed on an inner wall at the center of the electrode plate, a mounting cylinder is inserted at a top of the fixing cylinder, and the fixing rod is movably inserted inside the mounting cylinder.

7. The battery charger according to claim 4, wherein the resilient energy storage unit comprises a telescopic spring, with an end fixed on the top of the electrode plate, a surface of a mounting cylinder is fixedly equipped with a plurality of limit plates connected to an inner wall of a fixing cylinder, and another end of the telescopic spring is connected to the bottoms of the limit plates.

8. The battery charger according to claim 4, wherein a limit cylinder is fixedly installed on an inner bottom wall of the base cover, an inner cylinder is arranged inside the limit cylinder, and both the limit cylinder and the inner cylinder pass through the electrode plate and are located inside a fixing cylinder; and a telescopic spring is located inside the limit cylinder and sleeved on a surface of the inner cylinder, and the limit cylinder protects the telescopic spring; and the compression spring and the fixing rod are located inside the inner cylinder, the inner cylinder protects the compression spring and, at the same time, provides limit guidance for the fixing rod.

9. A battery charger, comprising:

a housing, formed by an upper cover assembly and a lower cover assembly configured with an openable and closable connecting mechanism, wherein the lower cover assembly is provided with a battery compartment; and a charging module, comprising a first conductive assembly arranged on the lower cover assembly, comprising an elastically deflectable contact spring; and a second conductive assembly arranged in the upper cover assembly, having a connection node spatially corresponding to the contact spring; and a liftable battery carrier mechanism, comprising:

a substrate axially displaceably installed in the battery compartment, carrying a battery and provided with a limit through-hole corresponding to the contact spring; and a push rod fixedly connected to the substrate; and a resilient energy storage unit coaxially arranged with the push rod, one end of which is fixedly connected to the push rod, and another end of which abuts against the lower cover assembly;

wherein in a case where the upper cover assembly is closed, the upper cover assembly forms mechanical interference with a top end of the push rod, driving the push rod to axially displace and compress the resilient energy storage unit, while moving the substrate downward to allow the contact spring to pass through the limit through-hole, establishing a circuit for charging the battery; and in a case where the upper cover assembly is opened, the resilient energy storage unit drives the push rod to displace reversely and lifts the substrate, causing a top of the battery to be higher than a lowest opening plane of the lower cover assembly.

10. The battery charger according to claim 2, wherein an indicator light is fixedly installed on a top of the outer upper cover, allowing an operator to intuitively monitor a charging status of the battery.

11. The battery charger according to claim 2, wherein the lower cover assembly comprises a base cover and an inner base cover arranged inside the base cover, and the base cover is connected to the outer upper cover via a hinge structure.

12. The battery charger according to claim 11, wherein one side of the base cover is provided with a spring-loaded cover button, and a bottom end of one side of the outer upper cover is fixedly equipped with a snap ring, wherein the snap ring and the spring-loaded cover button are located on a same side, and the opening and closing of the outer upper cover is can be achieved through the cooperation of the snap ring and the spring-loaded cover button.

13. The battery charger according to claim 12, wherein the upper cover assembly comprises an outer upper cover and an inner upper cover arranged inside the outer upper cover.

14. The battery charger according to claim 13, wherein the second conductive assembly comprises a circuit board arranged inside the inner upper cover, and a lower surface of the circuit board is provided with a plurality of metal contacts that are symmetrically distributed in a nine-square grid pattern.

15. The battery charger according to claim 13, wherein the lower cover assembly comprises a base cover and an inner base cover disposed inside the base cover, and the base cover is connected to the outer upper cover via a hinge structure.

16. The battery charger according to claim 15, wherein the first conductive assembly comprises an electrode plate disposed on an inner wall of the base cover, there are a plurality of contact springs that are circumferentially arrayed on a top of the electrode plate, and a compression spring is fixed at a center of the electrode plate, wherein a top of the compression spring is fixedly equipped with a fixing rod, and when the upper cover assembly is closed, a top end of the fixing rod contacts a metal contact at a center of a circuit board.

17. The battery charger according to claim 16, wherein the liftable battery carrier mechanism is a battery bracket; and the substrate is a mounting plate, which is disposed on the top of the electrode plate, and a center of the mounting plate is a hollow structure; and the limit through-hole is a limit hole, a diameter of which is larger than that of the contact spring but smaller than that of the battery, allowing the contact spring to pass through the limit hole; and the push rod is a fixing cylinder, which is fixedly installed on an inner wall at the center of the electrode plate, a mounting cylinder is inserted at a top of the fixing cylinder, and the fixing rod is movably inserted inside the mounting cylinder.

18. The battery charger according to claim 17, wherein the resilient energy storage unit comprises a telescopic spring, with an end fixed on the top of the electrode plate, a surface of the mounting cylinder is fixedly equipped with a plurality of limit plates connected to an inner wall of the fixing cylinder, and another end of the telescopic spring is connected to the bottoms of the limit plates.

19. The battery charger according to claim 17, wherein side walls of the fixing cylinder are curved, and an inner wall of the inner base cover is wavy, wherein a combination of the wavy inner wall and the curved side walls enables adaptive fixation of the battery through multi-point contact.

20. The battery charger according to claim 17, wherein a central area of the inner upper cover is recessed downward and contacts the top of the fixing cylinder; and in a case where the outer upper cover is closed, the recessed central area of the inner upper cover can exert a downward pressure on the fixing cylinder, causing the entire battery bracket to move downward.

* * * * *